(12) United States Patent
Zhang et al.

(10) Patent No.: US 9,728,623 B2
(45) Date of Patent: Aug. 8, 2017

(54) REPLACEMENT METAL GATE TRANSISTOR

(71) Applicant: Varian Semiconductor Equipment Associates, Inc., Gloucester, MA (US)

(72) Inventors: Ying Zhang, Santa Clara, CA (US); Steven Sherman, Newton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/921,731

(22) Filed: Jun. 19, 2013

(65) Prior Publication Data
US 2014/0374843 A1    Dec. 25, 2014

(51) Int. Cl.
| H01L 29/66   | (2006.01) |
| H01L 29/423  | (2006.01) |
| H01L 29/51   | (2006.01) |
| H01L 21/28   | (2006.01) |
| H01L 29/40   | (2006.01) |
| H01L 29/49   | (2006.01) |
| H01L 29/78   | (2006.01) |
| H01L 21/3213 | (2006.01) |
| H01L 21/311  | (2006.01) |

(52) U.S. Cl.
CPC .. *H01L 29/66545* (2013.01); *H01L 21/28088* (2013.01); *H01L 21/28114* (2013.01); *H01L 29/401* (2013.01); *H01L 29/42364* (2013.01); *H01L 29/42368* (2013.01); *H01L 29/42376* (2013.01); *H01L 29/4966* (2013.01); *H01L 29/513* (2013.01); *H01L 29/78* (2013.01); H01L 21/31105 (2013.01); H01L 21/31116 (2013.01); H01L 21/31122 (2013.01); H01L 21/32131 (2013.01); *H01L 21/32136* (2013.01); *H01L 29/517* (2013.01)

(58) Field of Classification Search
CPC .................................. H01L 29/66545
USPC .................. 438/525, 748, 585, 592
See application file for complete search history.

(56) References Cited

U.S. PATENT DOCUMENTS

| 6,271,094 B1 * | 8/2001  | Boyd ............... H01L 21/28114 |
|                |         | 257/E21.205 |
| 7,488,656 B2 * | 2/2009  | Cartier ............ H01L 21/28079 |
|                |         | 438/142 |
| 7,767,977 B1   | 8/2010  | Godet et al. |
| 8,101,510 B2   | 1/2012  | Godet et al. |
| 8,288,741 B1   | 10/2012 | Miller et al. |
| 2002/0034708 A1 | 3/2002 | Tseng |
| 2006/0030137 A1 | 2/2006 | Kim et al. |
| 2006/0121678 A1 | 6/2006 | Brask et al. |

(Continued)

FOREIGN PATENT DOCUMENTS

KR    1020080011491 A    5/2008

OTHER PUBLICATIONS

International Search Report and Written Opinion Mailed Nov. 13, 2014 for PCT/US2014/042358 Filed Jun. 13, 2014.

*Primary Examiner* — Yu-Hsi Sun

(57) ABSTRACT

A replacement metal gate transistor is described. Various examples provide a replacement metal gate transistor including a trench, a first sidewall and a second sidewall. A layer is disposed in the trench where the layer has a bottom section disposed on a bottom of the trench and sidewall sections disposed on the first and second sidewalls, wherein the sidewall sections of the layer are at least 50% thinner than the bottom section of the layer.

8 Claims, 10 Drawing Sheets

(56) References Cited

U.S. PATENT DOCUMENTS

| | | |
|---|---|---|
| 2006/0166419 A1 | 7/2006 | Shimoyama et al. |
| 2009/0098698 A1 | 4/2009 | Huang |
| 2010/0252531 A1 | 10/2010 | Godet et al. |
| 2011/0316075 A1 | 12/2011 | Hsieh |
| 2012/0217578 A1 | 8/2012 | Lim et al. |
| 2012/0217590 A1* | 8/2012 | Babich et al. ............... 257/410 |
| 2012/0256278 A1 | 10/2012 | Zhang et al. |
| 2013/0049109 A1 | 2/2013 | Lim et al. |

* cited by examiner

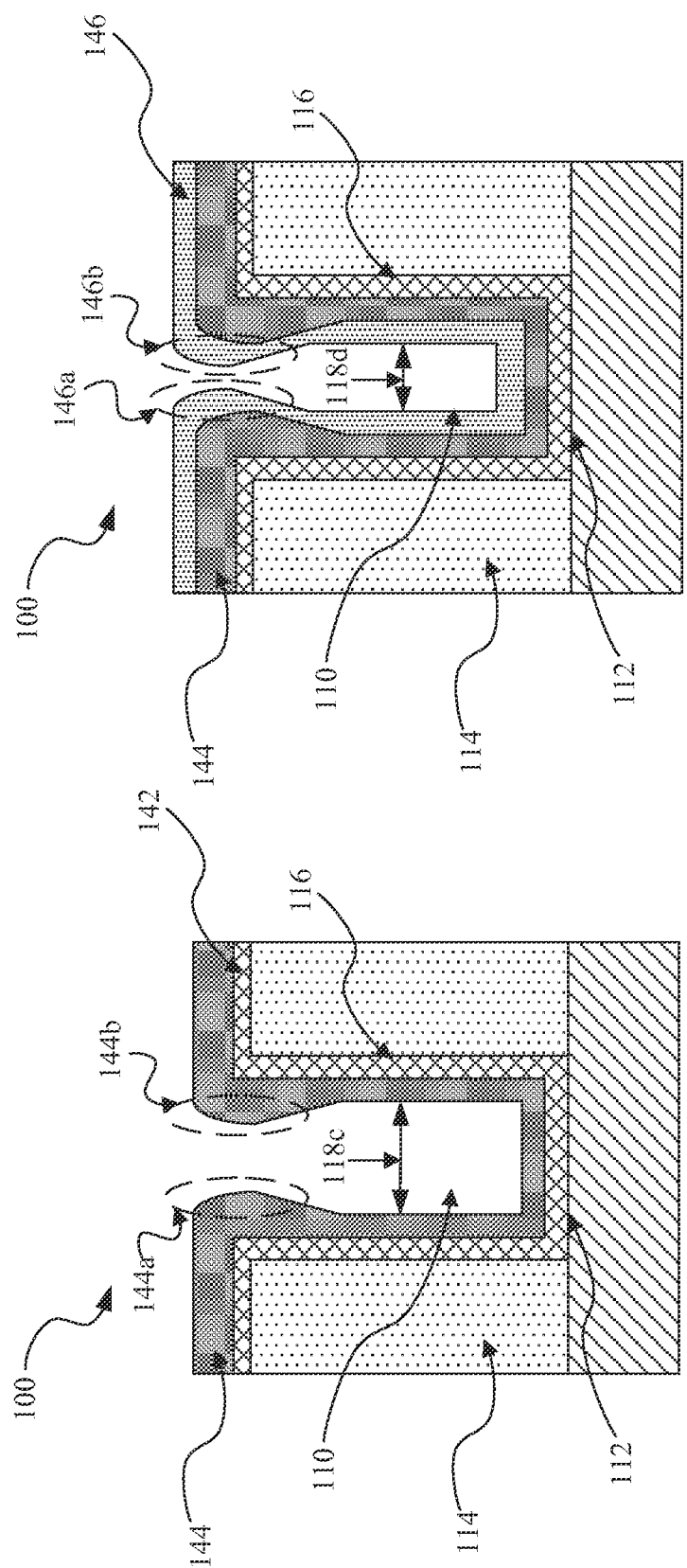

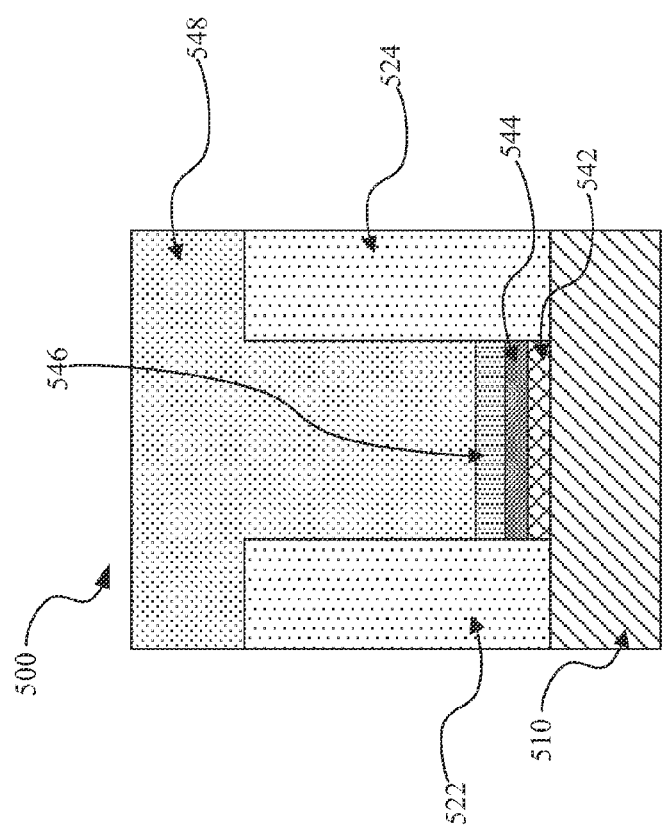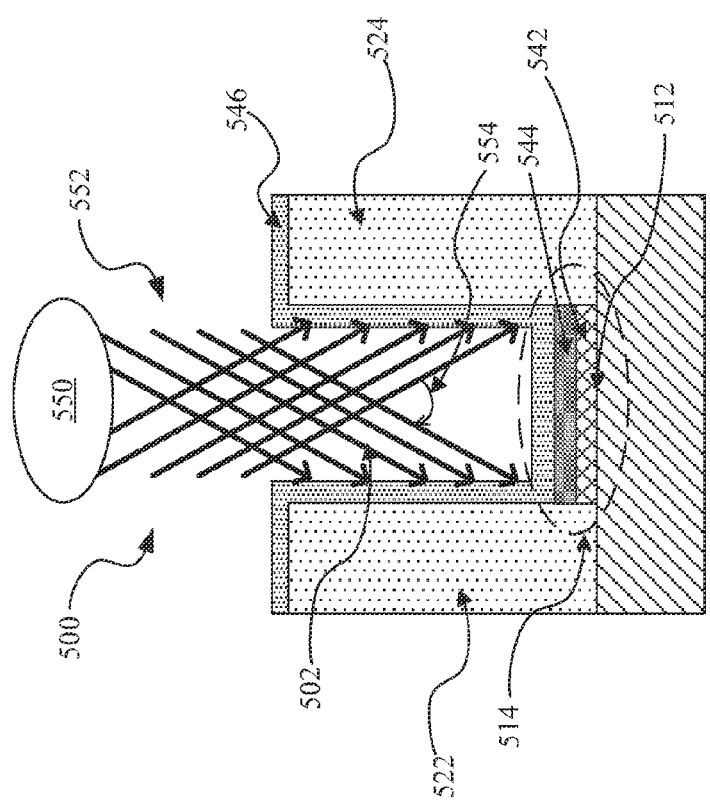

REPLACEMENT METAL GATE TRANSISTOR

FIELD OF THE DISCLOSURE

Embodiments of the present disclosure generally relate to semiconductor manufacturing, and more particularly to a replacement metal gate transistor.

BACKGROUND OF THE DISCLOSURE

A typical process flow for manufacturing replacement metal gate (RMG) transistors may include removing a temporary gate (sometimes referred to as a dummy gate), leaving a trench where various layers of material are deposited to form the RMG. For example, a dielectric layer may be deposited into the trench, followed by a first metal layer, a second metal layer, and a conductor layer. As will be appreciated, when each layer is deposited into the trench, material may be deposited onto the bottom of the trench as well as the sidewalls. The material build-up on the sidewalls, however, is not required for the RMG transistor to function properly. In some cases, the material build-up on the sidewalls may actually reduce the performance of the transistor. For example, some high-k dielectric build-up on the sidewalls of the trench may increase the parasitic capacitance within the RMG transistor and cause cross-talking with adjacent contacts.

As device structures and sizes are scaled down, the width of transistor gates also decreases. As such, the width of the trench described above for an RMG transistor also decreases. With each layer of material being deposited into the trench, the material build-up on the sidewalls of the trench further decreases the trench opening for subsequent layer depositions. Furthermore, each layer of material requires a minimum thickness to properly function. Accordingly, there are theoretical limits to the minimum gate width, the number of layers and each layers respective minimum thickness.

Additionally, as will be appreciated, deposition may be affected by the aspect ratio of the trench. A trenches aspect ratio is often represented as the ratio of the trench height to trench width. Deposition may be non-uniform at higher aspect ratios, which may manifest as thicker deposition higher on the sidewalls and thinner deposition lower on the sidewalls and at the bottom of the trench. With each successive deposition of a layer in the RMG, the aspect ratio of the trench will increase, possibly further exacerbating the non-uniformity of the deposition and further decreasing the trench width.

As such, there is a need to remove at least some portion of the material deposited on the sidewalls of the trench, in order to improve the transistor device performance, reduce the aspect ratio of the trench, improve quality and uniformity of depositions, and to allow devices with smaller gate widths to be manufactured.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a replacement metal gate transistor comprising a first layer deposited onto a bottom of the trench and onto sidewalls of the trench and a second layer deposited into the trench, where the second layer is deposited onto over the first layer and onto the bottom and sidewalls of the trench. A portion of the second layer is removed from the sidewalls of the trench.

Further embodiments include a replacement metal gate transistor comprising a dielectric layer disposed on a substrate and on inner sidewalls of a trench, wherein the dielectric layer has a bottom section and sidewall sections, a first metal layer disposed on the bottom section of the dielectric layer, a second metal layer disposed on the bottom section of the first metal layer, and a conductor layer disposed on the second metal layer and the sidewall sections of the dielectric layer.

BRIEF DESCRIPTION OF THE DRAWINGS

By way of example, various embodiments of the disclosed device will now be described, with reference to the accompanying drawings, in which:

FIGS. 1A-1E are block diagrams of an RMG gate transistor;

FIGS. 2A-2C are a block diagrams of an RMG transistor manufactured according to at least some embodiments of the present disclosure;

FIGS. 5A-5D are a block diagrams of another RMG transistor manufactured according to at least some embodiments of the present disclosure;

DETAILED DESCRIPTION

As described above, a typical process for manufacturing an RMG transistor may include removing a temporary gate, leaving a trench; and then filling in the trench by depositing layers of material to form the RMG. In general, the RMG may be formed using any number of suitable thin film deposition techniques (e.g., atomic layer deposition, plasma deposition, ion deposition, or the like) or process flows.

Figure 1B:
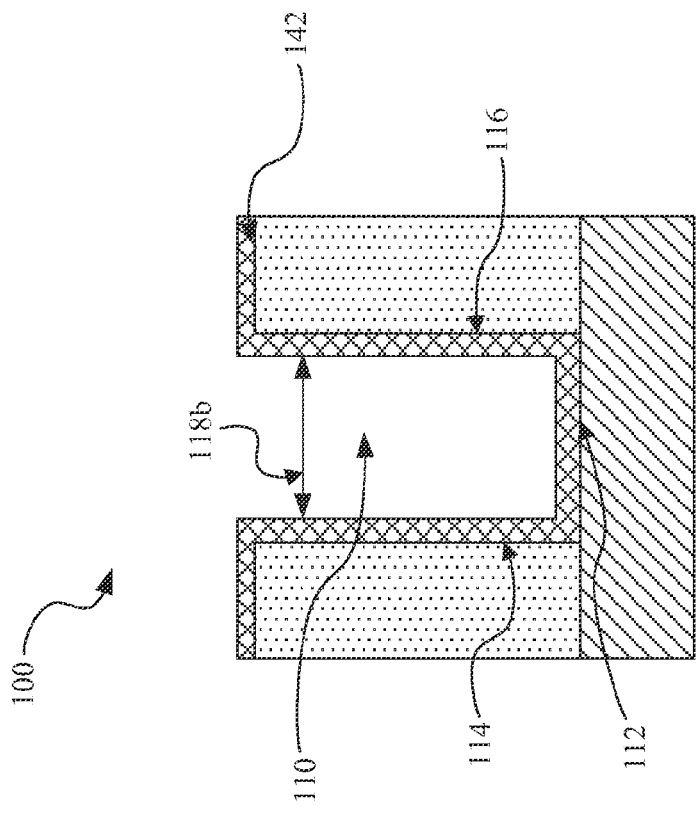
Figure 1A:
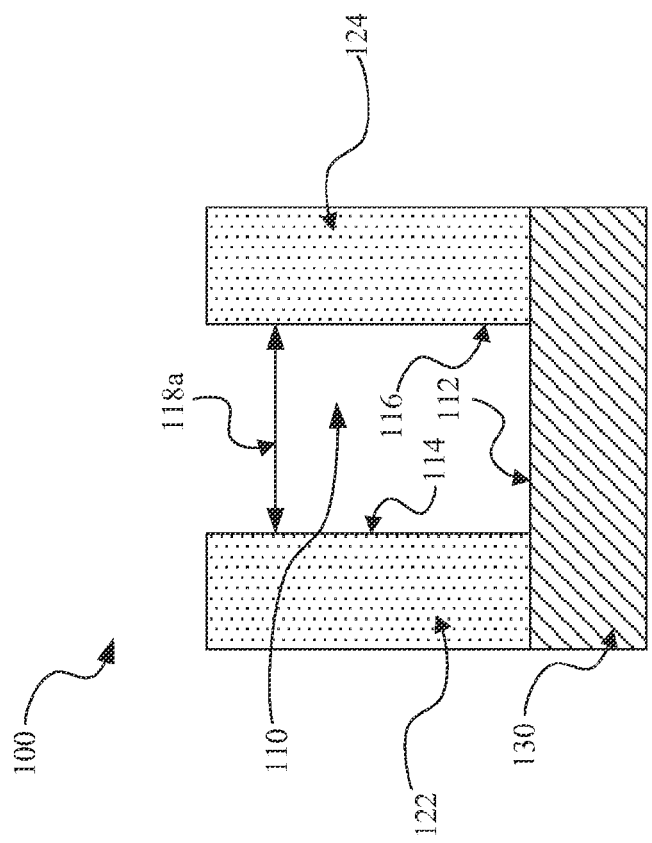

FIG. 1A illustrates a block diagram of an RMG transistor 100 part way through its fabrication process, after the temporary gate (not shown) has been removed. As depicted, the RMG transistor 100 includes a trench 110 formed between sidewalls 122, 124, which are built up on substrate 130. The trench 110 includes a bottom 112 and inner sidewalls 114, 116; and has an initial width 118a (sometimes referred to as "gate width.") In some examples, the substrate 130 may be silicon and the sidewalls 122, 124 may be silicon dioxide, silicon nitride, or some other silicon-based dielectric material. As will be appreciated, the materials referenced herein to describe the RMG transistor 100, are given for illustrative purposes only and are not intended to be limiting. Other materials may be substituted without departing from the scope of the present disclosure.

FIG. 1B illustrates a block diagram of the RMG transistor 100, having a first layer 142 deposited into the trench 110. As depicted, the first layer 142 has been deposited onto the bottom 112 and inner sidewalls 114, 116 of the trench 110. As will be appreciated, due to the deposition of the first layer 142 onto the inner sidewalls 114, 116, the initial width of the trench opening 118a has been reduced to the width 118b. In general, the initial width 118a will be reduced by approximately twice the thickness of the first layer 142. Thus, the aspect ratio of the trench 110 will be increased. In some examples, the first layer 142 may be formed from a dielectric material. In further examples, the first layer 142 may be formed from a high-k dielectric material (e.g., hafnium silicate, zirconium silicate, hafnium dioxide, or zirconium dioxide).

FIG. 1C illustrates a block diagram of the RMG transistor 100, having a second layer 144 deposited into the trench 110. As depicted, the second layer 144 has been deposited onto the bottom 112 and inner sidewalls 114, 116 of the trench 110 and over the first layer 142. As described above, deposition may be affected by the aspect ratio of the trench 110. For example, at higher aspect ratios, the uniformity of the deposition may decrease, resulting in increased deposition thickness near the top of the trench 110 and recued deposition thickness near the bottom of the trench 110. More specifically, this non-uniformity may manifest as corners 144a, 144b. Additionally, as will be appreciated, due to the deposition of the second layer 144 onto the inner sidewalls 114, 116, the width 118b has been reduced (e.g., by approximately twice the thickness of the second layer 144) to width 118c. Thus, the aspect ratio of the trench 110 has again been increased. In some examples, the second layer 144 may be a formed from a material having a substantially low conductivity (e.g., titanium nitride).

FIG. 1D illustrates a block diagram of the RMG transistor 100, having a third layer 146 deposited into the trench 110. As depicted, the third layer 146 has been deposited onto the bottom 112 and inner sidewalls 114, 116 of the trench 110 and over the second layer 144. The third layer 146 is depicted as having less uniform deposition than either the first layer 142 or the second layer 144, represented by corners 146a, 146b. Additionally, as will be appreciated, due to the deposition of the third layer 146 onto the sidewalls 114, 116, the width 118c has been reduced (e.g., by approximately twice the thickness of the third layer 146) to width 118d. Thus, the aspect ratio of the trench 110 has again been increased.

Figures 1E, 2A:
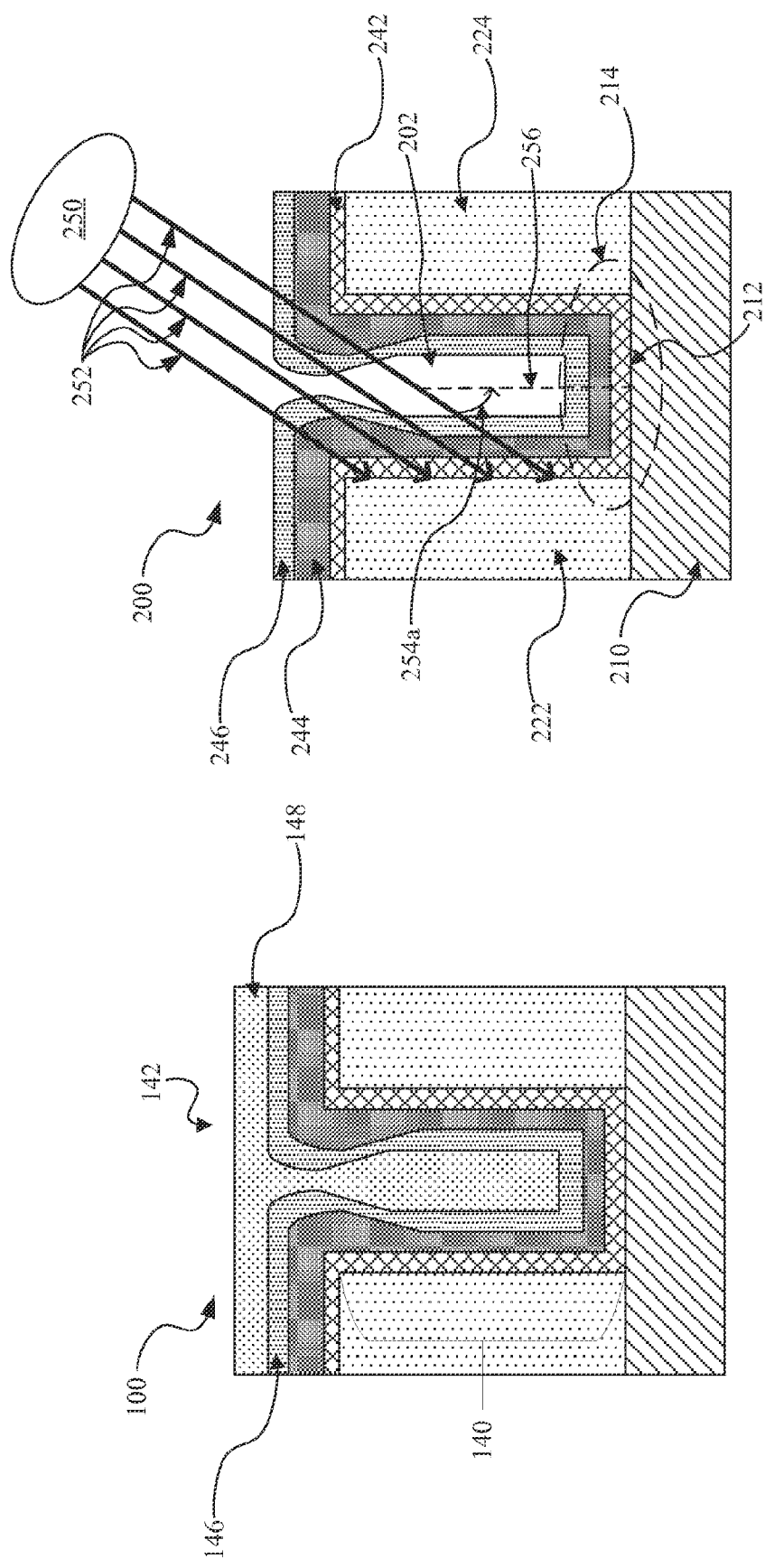

FIG. 1E illustrates a block diagram of the RMG transistor 100, having the trench 110 filled in with a "contact layer," 148. In general, the contact layer 148 serves as the main path of electrical conduction along the length of the trench. As such, material for the contact layer 148 is chosen from materials having relatively low electrical resistivity (e.g. tungsten or aluminum). As depicted, the contact layer 148 has been deposited into the remaining portion of the trench 110, overlaying the third layer 146, forming RMG stack 140.

The speed of an integrated circuit (IC) built with transistors such as the one illustrated in FIG. 1 is limited by the electrical resistance along the filled trench 110, and also by the electrical capacitance between two such filled trenches. Therefore the performance of such an IC can be improved by removing at least some of the RMG layers (e.g., the first layer 142, the second layer 144, or the third layer 146) from the trench sidewalls 114, 116. Removing these RMG layers, which typically have relatively high electrical resistivity will make more space for the contact layer 148 which has relatively low electrical resistivity, resulting in a RMG transistor 100 with lower overall electrical resistance. Second, removing the first layer 142, which typically has a high dielectric constant, will reduce the electrical capacitance between two such RMG transistors.

As will be appreciated, each layer of the RMG 140 may have a corresponding minimum thickness (e.g., 2 nanometers, or the like) in order to function properly. Accordingly, as device sizes continually scale down, the gate width may not be sufficient to allow for the proper deposition of the various layers of the RMG 140. For example, the gate width may have a theoretical minimum limit of approximately $2*N_{layers}*Thick_{min}$, where $N_{layers}$ equals the number of layers in the RMG 140 and $Thick_{min}$ equals the minimum thickness per layer. Furthermore, as illustrated in FIGS. 1A-1E, the width 118 near the top of the trench 110 may decrease quicker than the width 118 near the bottom 112 of the trench 110. As such, deposition of the contact layer 148 on the bottom 112 of the trench 110 may be difficult using conventional techniques.

It is to be appreciated, that the RMG transistor 100 described with reference to FIGS. 1A-1E is provided for illustrative purposes only and is not intended to be limiting. Various embodiments of the present disclosure may be applied to processing an RMG transistor having a composition similar to that depicted with reference to FIGS. 1A-1E. Alternatively, various embodiments of the present disclosure may be applied to processing an RMG transistor having a composition different (e.g., having a different number of layers, different material of manufacture, or the like) than that depicted with reference to FIGS. 1A-1E. For example, an RMG transistor may have more or fewer layers than described above. More particularly, an RMG transistor may have only three total layers such as the layers 142, 144, and 146 depicted in FIG. 1, or it may have additional layers not shown in FIG. 1. Although the following example embodiments reference an RMG transistor having three layers, it is to be appreciated that this is done for purposes of clarity and is not intended to be limiting.

As introduced above, various embodiments of the present disclosure may be applied to reduce the aspect ratio of trench during manufacturing of an RMG transistor. For example, various embodiments of the present disclosure may be applied to reduce the aspect ratio of the trench 110 shown in FIGS. 1A-1E. The aspect ratio of the trench 110 may be reduced, by, for example, removing portions of the layers (e.g., the layer 142, 144, and/or 146) from the sidewalls 114, 116. With at least some embodiments of the present disclosure, portions of the layers may be removed using an angled ion beam, which may be configured to etch, sputter, or otherwise remove portions of the layers from the inner sidewalls.

Some embodiments of the present disclosure will now be described in greater detail with reference to various illustrative examples. It is to be appreciated that these examples are given for illustration only and are not intended to be limiting.

Illustrative Example 1

FIG. 2A illustrates a block diagram of an RMG transistor 200, arranged according to at least some embodiments of the present disclosure. As depicted, the RMG transistor 200 is shown prior to deposition of a contact layer, which typically has a relatively low electrical resistivity for the purpose of reducing the electrical resistance of the gate line. The RMG transistor includes a first layer 242 deposited into a trench 202 formed between sidewalls 222, 224 and substrate 210.

In some examples, the first layer 242 may be referred to as a dielectric layer. Second and third layers 244, 246 are also shown. In some examples, the second and third layers 244, 246 may be referred to as first and second metal layers respectively. An ion source 250 generating angled ion beams 252 is also shown. The angled ion beams 252 are incident upon the layers 242, 244, and 246 built-up on the sidewall 222. In general, the angled ion beams 252 may be used to at least partially remove (e.g., via sputtering, etching, or the like) material from the layers 242, 244, and/or 246 that are built-up on the sidewall 222. In some examples, the angle 254a of the angled ion beams 252 (shown measured relative a line 256 perpendicular to the bottom 212) may be selected such that the ion beams are incident upon the sidewall 222, but not the bottom 212. More specifically, the angle 254a may be selected such that the material on the bottom 212 (e.g., shown by dashed area 214) is substantially not removed by the angled ion beams 252 because the ion beams 252 are shadowed by sidewall 224. In some embodiments, the ion beam 252 assists a reactive ion etch where substantially all of the etched material is chemically volatilized, as opposed to the ion beams 252 sputtering the material where a substantial amount of the sputtered material is physically and may re-deposit inside the trench. Re-deposition of removed material inside the trench may be undesirable because the RMG transistor's performance is sensitive to the composition of the various layers as well as the condition of their surfaces and interfaces.

Figure 2C:
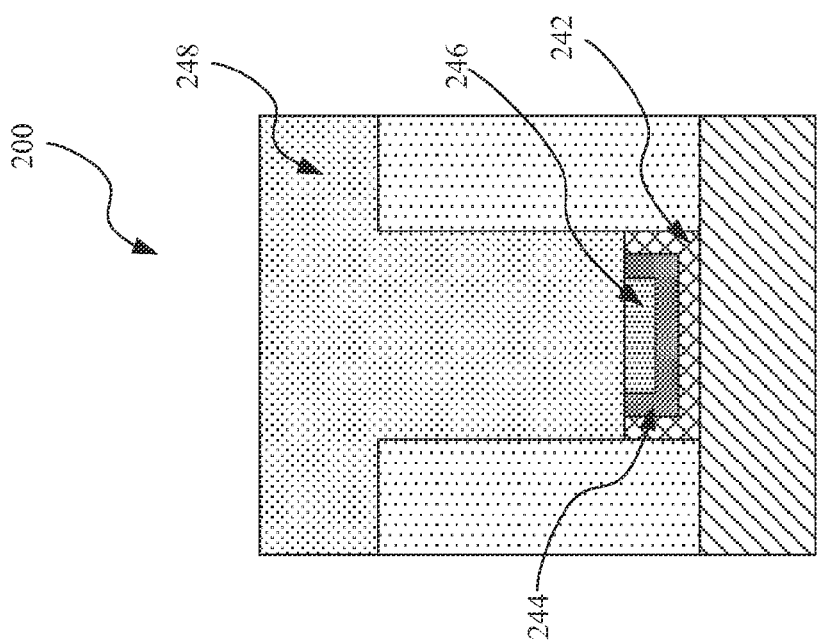
Figure 2B:
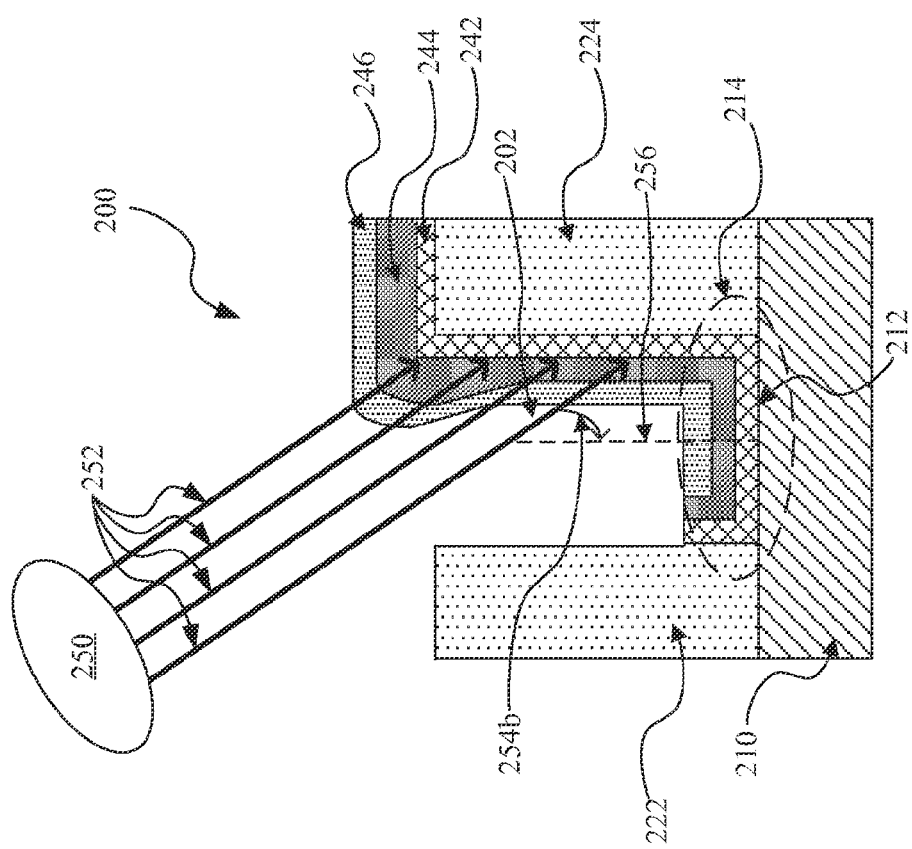

FIG. 2B illustrates a block diagram of the RMG transistor 200, arranged according to at least some embodiments of the present disclosure. As depicted, the RMG transistor is shown after material from the layers 242, 244, and 246 built-up on the sidewall 222 has been removed. The angled ion beams 252 are incident upon the layers 242, 244, and 246 built-up on the sidewall 224. In general, the angled ion beams 252 may be used to at least partially remove (e.g., via sputtering, etching, or the like) material from the layers 242, 244, and/or 246 that are built-up on the sidewall 222. In some examples, the angle 254b of the angled ion beams 252 (shown measured relative a line 256 perpendicular to the bottom 212) may be selected such that the ion beams are incident upon the wall 222, but not the bottom 212. More specifically, the angle 254b may be selected such that the material on the bottom 212 (e.g., shown by dashed area 214) is substantially not removed by the ion beams 252 because the ion beams 252 are shadowed by sidewall 222. In some examples, the ion source 250 may be moved, adjusted, or rotated from the positioning shown in FIG. 2A, such that the angled ion beams 252 are incident upon the sidewall 224 as shown in FIG. 2B. As used herein, the term "substantially" when referring to ion beam trajectories shall mean less than 10%. For example, FIGS. 2A and 2B show the ion beams 252 incident upon the sidewalls 222, 224 but not the bottom 212. In practice, some ion from the ion beams 252 may be incident upon the bottom 212. As such, the term "substantially" may be used to indicate that a small portion (e.g., 10% or less) of the ions from the ion beams 252 are incident upon the bottom 212.

FIG. 2C illustrates a block diagram of the RMG transistor 200, arranged according to at least some embodiments of the present disclosure. As depicted, angled ion beams 252 have removed material from layers 242, 244, and 246 built-up on the sidewalls 222, 224 of the RMG transistor 200. Additionally, a contact layer 248 is shown having been deposited into the trench and onto the remaining material from the layers 242, 244, and 246. As used herein, the term "substantially" when referring to the thickness of the bottom sections (e.g. 214) or the thickness of the sidewall sections of the layers 242, 244, and/or 246 shall mean at least 50%. For example, FIG. 2C shows the material on the bottom 212 of the trench 214 including at least 50% of the original material. Conversely, the material on the sidewalls 222, 224 is shown as having greater than 50% removed. Accordingly, as used herein, substantially not removed shall mean at least 50% of the original material remains and substantially removed shall mean at least 50% of the original material is removed.

Illustrative Example 2

Figure 3B:
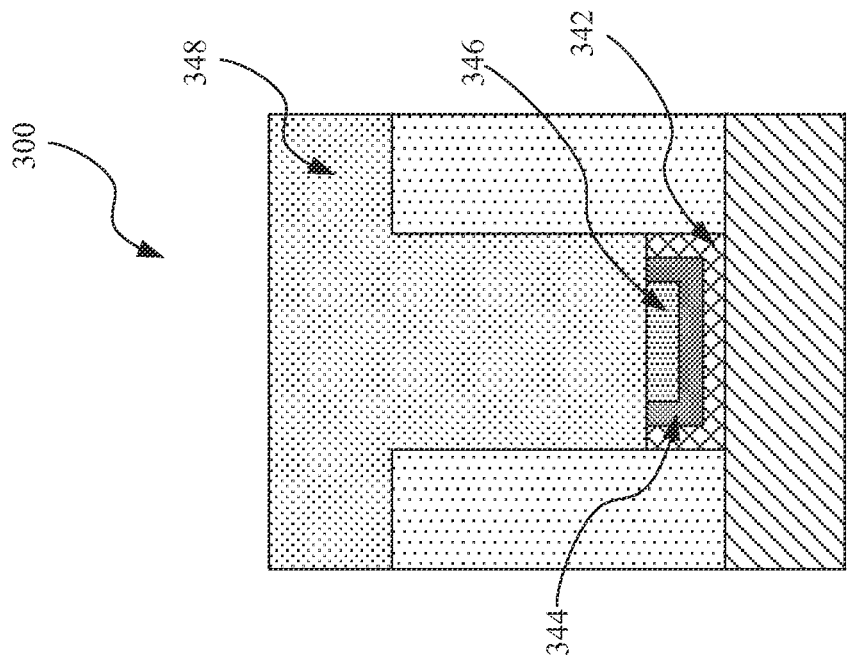
FIGS. 3A-3B are a block diagrams of another RMG transistor manufactured according to at least some embodiments of the present disclosure.
Figure 3A:
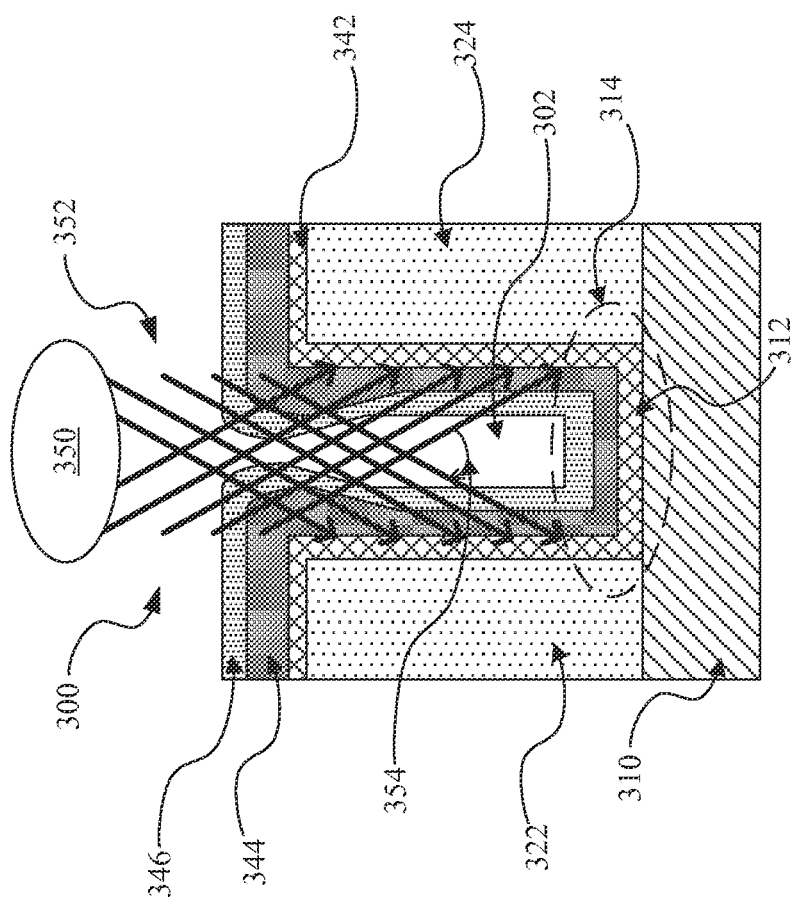

FIG. 3A illustrates a block diagram of an RMG transistor 300, arranged according to at least some embodiments of the present disclosure. As depicted, the RMG transistor is shown prior to deposition of the contact layer. The RMG transistor includes a first layer 342 deposited into a trench 302 formed between sidewalls 322, 324 and substrate 310. Second and third layers 344, 346 are also shown. An ion source 350 generating angled ion beams 352 is also shown. In some embodiments, the ion source 350 may be configured to generate angled ion beams 352 such that the angled ion beams are incident upon the sidewalls 322, 324, but not the bottom 312. More specifically, the angle 354 may be selected such that the material on the bottom 312 (e.g., shown by dashed area 314) is substantially not removed by the angled ion beams 352 because the ion beams 352 are shadowed by sidewalls 322, 324.

With some examples, the ion source 350 may be a plasma ion source. The plasma ion source may include a plasma process chamber having a plasma sheath positioned adjacent to the RMG transistor 300. The shape of the plasma sheath may be modified with an insulating modifier, which influences the incident angles of ions extracted from the plasma relative to the plane of the trench bottom 312. The insulating modifier can create an ion angle distribution such that no ion trajectories are perpendicular to or near perpendicular to the bottom 312 of the RMG transistor 300.

FIG. 3B illustrates a block diagram of the RMG transistor 300, arranged according to at least some embodiments of the present disclosure. As depicted, angled ion beams 352 have removed material from the layers 342, 344, and 346 built-up on the sidewalls 322, 324 of RMG transistor 300. Additionally, a contact layer 348 has been deposited into the trench and onto the remaining material from the layers 342, 344, and 346.

Illustrative Example 3

Figure 4B:
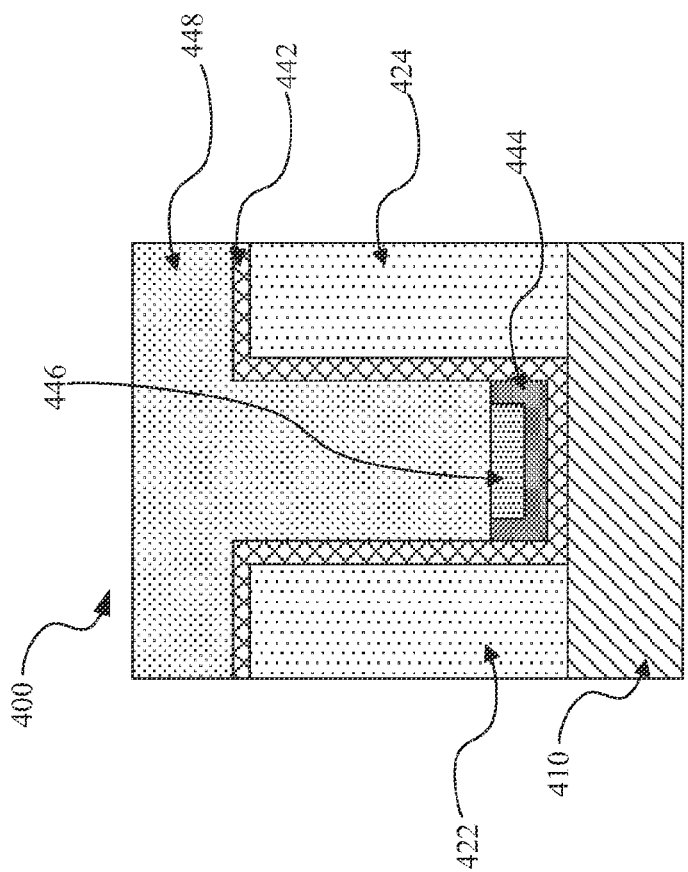
FIGS. 4A-4B are a block diagrams of another RMG transistor manufactured according to at least some embodiments of the present disclosure.
Figure 4A:
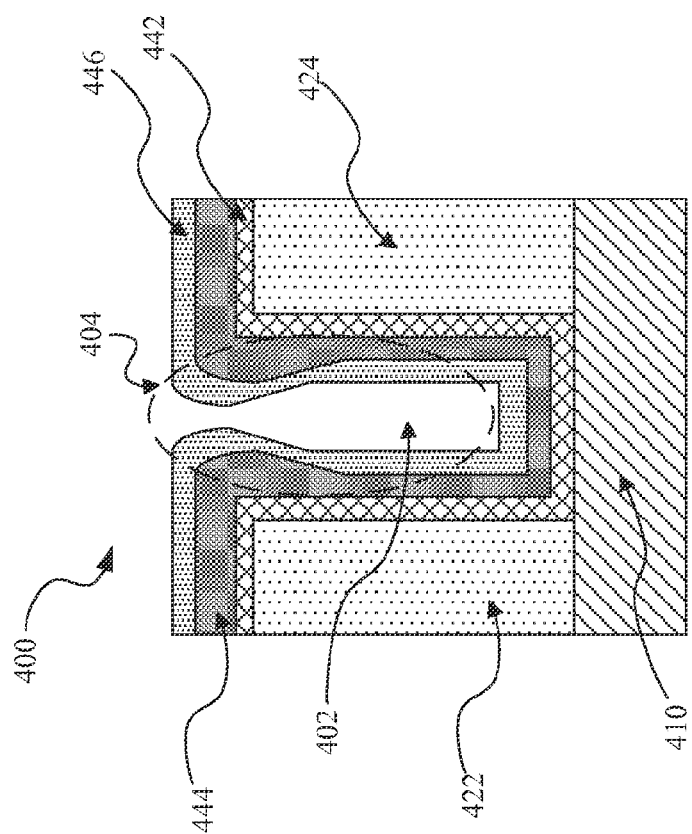

FIG. 4A illustrate a block diagram of an RMG transistor 400, arranged according to at least some embodiments of the present disclosure. As depicted, RMG transistor is shown prior to deposition of the contact layer. The RMG transistor includes a first layer 442 deposited into a trench 402 formed between sidewalls 422, 424 and substrate 410. Second and third layers 444, 446 are also shown. An angled ion source, such as, for example, as described above with respect to illustrative examples 1 or 2, may be used to remove material from second and third layers 444, 446, shown by area 404. The angled ion source, however, is not shown in FIG. 4A for clarity. In some examples, it may be advantageous to stop removing material from the sidewalls 422, 424 at the first layer 442. For example, removal of the first layer 442 (e.g., via etching or sputtering) may be difficult. Additionally, it may be advantageous to prevent removal of any material from the sidewalls 422, 424. As such, stopping removal of material at the first layer 442 may assist in preventing removal of material from the sidewalls 422, 424. With some embodiments, removal of material from the sidewalls 422, 424 may be stopped when a portion of the first layer (e.g., which may be a dielectric layer) has been exposed.

FIG. 4B illustrates a block diagram of the RMG transistor 400, according to at least some embodiments of the present disclosure. As depicted, the RMG transistor 400 is shown having material from the area 404 shown in FIG. 4A removed. Removal of material from the sidewalls 422, 424 has been stopped at the first layer 442. As such, the first layer 442 is depicted as substantially unchanged from that shown in FIG. 4A. Additionally, a contact layer 448 has been deposited into the trench and onto the remaining material from the layers 442, 444, and 446.

Illustrative Example 4

Figures 5A, 5B:
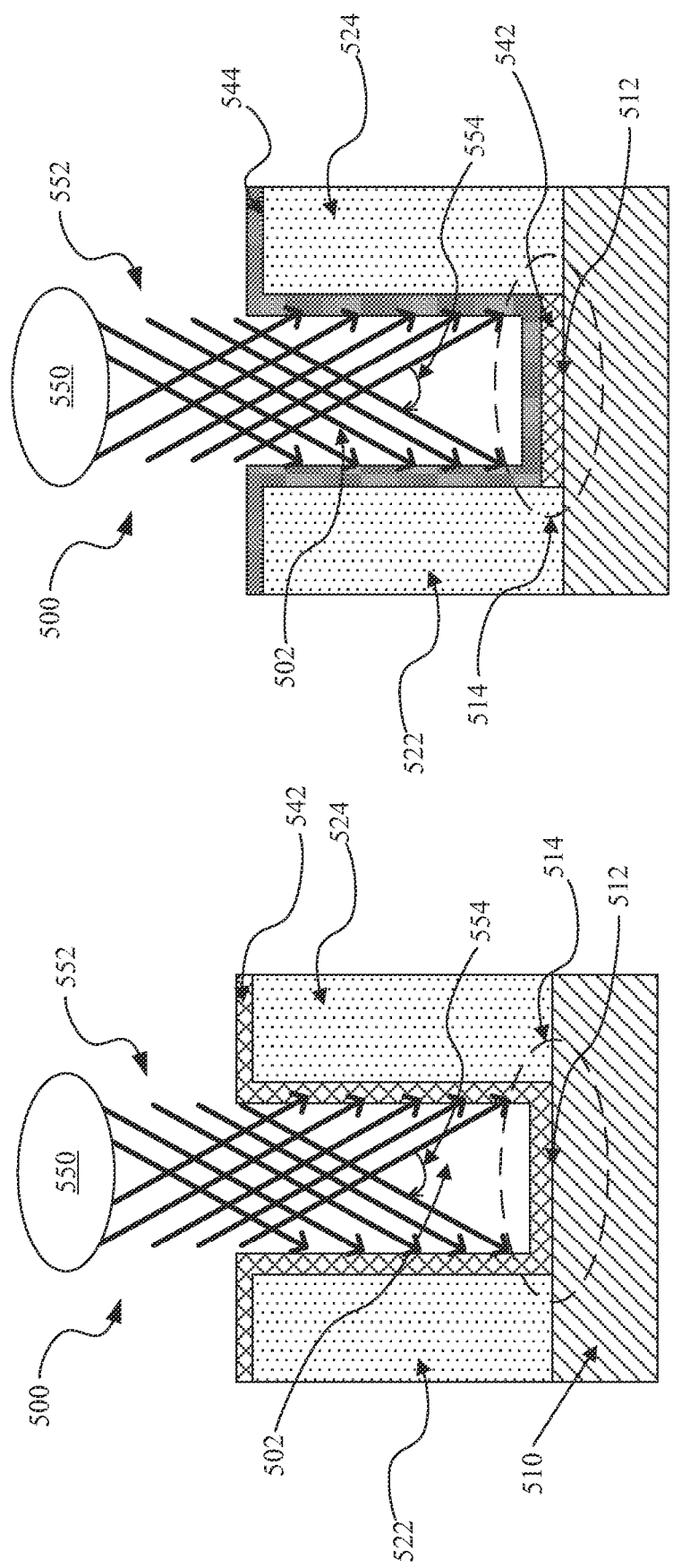

In some embodiments, material built-up on the sidewalls after deposition of a particular layer (e.g., the first layer, or the like) may be removed prior to deposition of another layer. For example, FIG. 5A illustrates a block diagram of an RMG transistor 500, arranged according to at least some embodiments of the present disclosure. As depicted, the RMG transistor 500 is shown after deposition of a first layer. More specifically, the RMG transistor 500 includes a first layer 542 deposited into a trench 502, the trench 502 being formed between sidewalls 522, 524 and substrate 510.

An ion source 550 generating angled ion beams 552 is also shown. In some embodiments, the ion source 550 may be configured to generate angled ion beams 552 such that the angled ion beams are incident upon the sidewalls 522, 524, but not the bottom 512. More specifically, the angle 554 may be selected such that the material on the bottom 512 (e.g., shown by dashed area 514) is substantially not removed by the angled ion beams 552; while the material on the sidewalls 522 and 526 is substantially removed by the angled ion beams 552 because the ion beams 552 are shadowed by sidewalls 522, 524. With some examples, the ion source 550 may be configured similar to that described above with respect to FIGS. 3A-3B. As will be appreciated, in practice a portion of the first layer 542 may remain on the sidewalls 522, 524. For example, substantially all of the first layer 542 may be removed from the sidewalls 522, 524. However, small amounts (e.g., less than 1 nanometer, or the like) of material may remain on the sidewalls 522, 524 after the angled ion beams 552 are used to remove the material. Also as will be appreciated, a portion of the full thickness of the first layer 542 may remain near the bottom of the sidewalls 522, 524.

FIG. 5B illustrates a block diagram of the RMG transistor 500, arranged according to at least some embodiments of the present disclosure. As depicted, the RMG transistor 500 is shown after material from the layer 542 built-up on the sidewalls 522, 524 has been removed. Additionally, a second layer 544 has been deposited into the trench 502. As depicted, the second layer 544 has been deposited over the first layer 542 on the bottom of the trench 512. However, as the first layer 542 has been removed from the sidewalls 522, 524, as described with respect to FIG. 5A, the second layer 544 is depicted as being deposited directly onto the sidewalls 522, 524. As stated above, in some examples, small amounts of the first layer 542 may remain on the sidewalls 522, 524. However, these small amount are not shown in FIG. 5B for purposes of clarity of presentation.

The ion source 550, generating angled ion beams 552, is also shown. In some embodiments, the ion source 550 may be configured to generate angled ion beams 552 such that the angled ion beams are incident upon the sidewalls 522, 524, but not the bottom 512. More specifically, the angle 554 may be selected such that the material on the bottom 512 (e.g., shown by dashed area 514) is substantially not removed by the angled ion beams 552; while the material on the sidewalls 522 and 526 is substantially removed by the angled ion beams 552 because the ion beams 552 are shadowed by sidewalls 522, 524. As will be appreciated, in practice a portion of the second layer 544 may remain on the sidewalls 522, 524. For example, substantially all of the second layer 544 may be removed from the sidewalls 522, 524. However, small amounts (e.g., less than 1 nanometer, or the like) of material may remain on the sidewalls 522, 524 after the angled ion beams 552 are used to remove the material.

FIG. 5C illustrates a block diagram of the RMG transistor 500, arranged according to at least some embodiments of the present disclosure. As depicted, the RMG transistor 500 is shown after material from the layer 544 built-up on the sidewalls 522, 524 has been removed. Additionally, a third layer 546 has been deposited into the trench 502. As depicted, the third layer 546 has been deposited over the second layer 544 on the bottom of the trench 512. However, as the second layer 544 has been removed from the sidewalls 522, 524, as described with respect to FIG. 5B, the third layer 546 is depicted as being deposited directly onto the sidewalls 522, 524. As stated above, in some examples, small amounts of the second layer 544 may remain on the sidewalls 522, 524. However, these small amount are not shown in FIG. 5C for purposes of clarity of presentation.

The ion source 550, generating angled ion beams 552, is also shown. In some embodiments, the ion source 550 may be configured to generate angled ion beams 552 such that the angled ion beams are incident upon the sidewalls 522, 524, but not the bottom 512. More specifically, the angle 554 may be selected such that the material on the bottom 512 (e.g., shown by dashed area 514) is substantially not removed by the angled ion beams 552; while the material on the sidewalls 522 and 526 is substantially removed by the angled ion beams 552 because the ion beams 552 are shadowed by sidewalls 522, 524. As will be appreciated, in practice a portion of the third layer 546 may remain on the sidewalls 522, 524. For example, substantially all of the third layer 546 may be removed from the sidewalls 522, 524. However, small amounts (e.g., less than 1 nanometer, or the like) of material may remain on the sidewalls 522, 524 after the angled ion beams 552 are used to remove the material. Also as will be appreciated, a portion of the full thickness of the first layer 542 may remain near the bottom of the sidewalls 522, 524.

FIG. 5D illustrates a block diagram of the RMG transistor 500, arranged according to at least some embodiments of the present disclosure. As depicted, the first layer 542, second layer 544, and third layer 546 has been deposited into the trench. Material built-up on the sidewalls 522, 524 after the deposition of each layer has been removed (e.g., using an angled ion beam as described above) prior to deposition of subsequent layers, for example, as depicted with respect to FIGS. 5A-5C. Additionally, a contact layer 548 has been deposited into the trench and onto the third layer 546.

Illustrative Example 5

Figure 6:
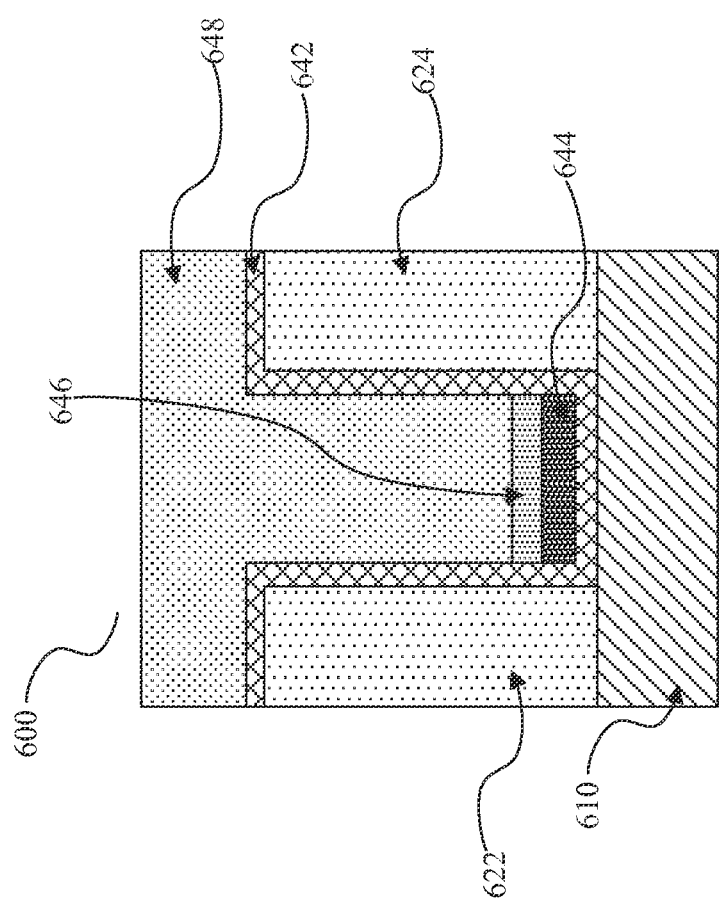
FIG. 6 is a block diagram of another RMG transistor manufactured according to at least some embodiments of the present disclosure.

In some embodiments, material built-up on the sidewalls after deposition of a particular layer (e.g., the second layer, or the like) may be removed prior to deposition of another layer. Additionally, the first layer (e.g., a high-k dielectric layer, or the like) may be used to stop the removal of material from the sidewalls and/or prevent removal of sidewall material. For example, FIG. 6 illustrates a block diagram of an RMG transistor 600, arranged according to at least some embodiments of the present disclosure. As depicted, a first layer 642 has been deposited into the trench. Additionally, a second layer 644 and third layer 646 has been deposited into the trench. In the RMG transistor shown, after deposition of the first layer 642 and second layer 644, material from the second layer 644 is removed from the sidewalls 622, 624, (e.g., using an angled ion beam as described above), but the material of first layer 642 remains upon the sidewalls 622, 624. Subsequently, the third layer 646 is deposited and material from the third layer 646 is removed from the sidewalls 622, 624, (e.g., using an angled ion beam as described above) resulting in the structure shown. Additionally, a contact layer 648 has been deposited into the trench and onto the third layer 646.

Illustrative Example 6

Figure 7:
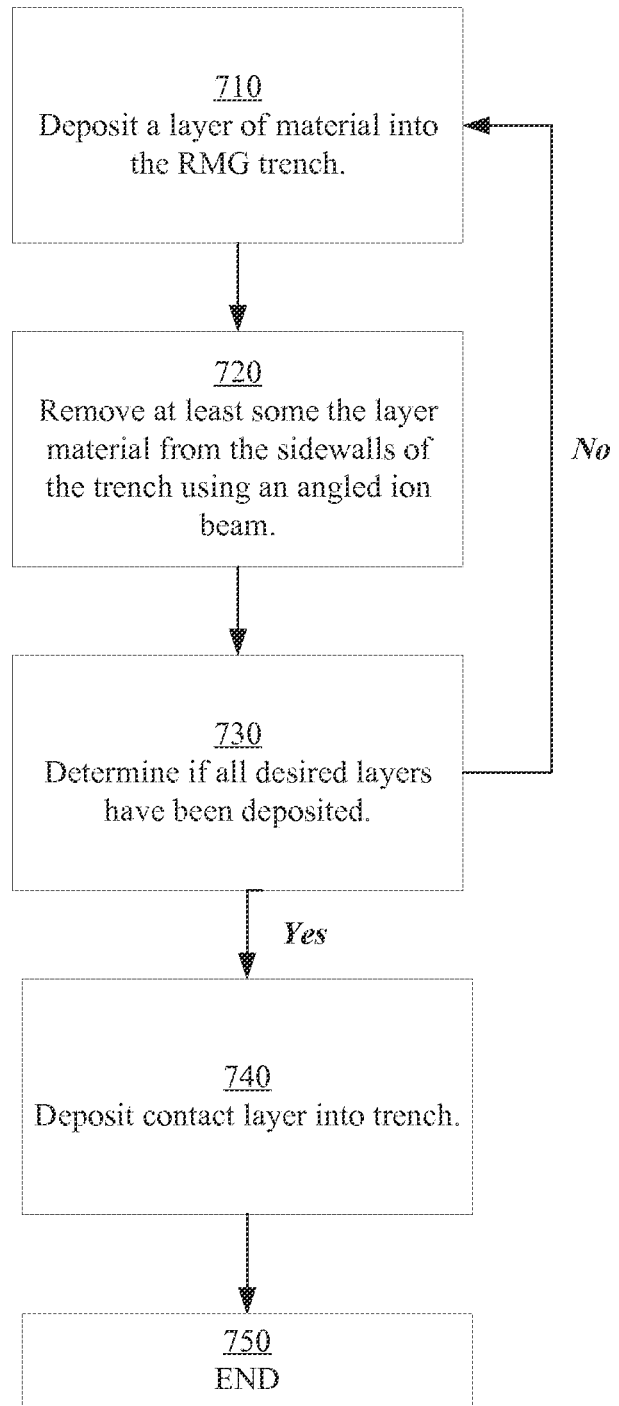
FIG. 7 is a flow chart illustrating a method of cleaning an RF source, all arranged in accordance with at least some embodiments of the present disclosure.

FIG. 7 is a flow chart illustrating a method 700 for forming an RMG transistor, arranged in accordance with at least some embodiments of the present disclosure. In general, the method 700 is described with reference to the RMG transistor 300 and the ion source 350 and angled ion beams 352 of FIGS. 3A-3B.

The method 700 may begin at block 710. At block 710, a layer of material (e.g., the first layer 442, the second layer 444 and/or the third layer 446) is deposited into the trench. Continuing from block 710 to block 720, at least some of the material deposited into the trench is removed from the sidewalls 422, 424 of the trench. More particularly, the ion source 450 and the angled ion beams 452 are used to remove (e.g., via etching, sputtering, or the like) the material from the deposited layer that is built-up on the sidewalls 422, 424 without substantially removing material deposited onto the bottom 412 of the trench.

Continuing from block 720 to block 730, a determination is made as to whether all desired layers have been deposited into the trench. If all layers have been deposited, then the process continues to block 740, and a contact layer may be deposited into the trench and then the process may end at block 750. If, however, additional layers are to be deposited, the process may return to block 710, where another layer may be deposited into the trench.

In some examples, multiple layers may be deposited and then have material from one or more of the deposited layers built-up on the sidewalls 422, 424 removed. With other examples, a single layer may be deposited and then have material from the layer built-up on the sidewalls 422, 424 removed prior to deposition of another layer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A replacement metal gate transistor comprising:
a trench having a bottom, a first sidewall and a second sidewall;
a dielectric layer disposed in the trench, the dielectric layer having a bottom section disposed on the bottom of the trench and sidewall sections disposed on the first and second sidewalls, the bottom section having a top surface defining a plane;
a metal layer disposed in the trench, the metal layer having a bottom section disposed on the bottom section of the dielectric layer and sidewall sections disposed on the sidewall sections of the dielectric layer, wherein the sidewall sections of the metal layer extend partially up the sidewall sections of the dielectric layer such that at least a portion of the sidewall sections of the dielectric layer extend a perpendicular distance from the plane that is further from the plane than a farthest perpendicular distance from the plane to which any portion of the metal layer extends; and
a contact layer disposed on, and in direct contact with each of, the bottom section of the metal layer, the sidewall sections of the metal layer, and portions of the sidewall sections of the dielectric layer that are not covered by the metal layer.

2. The replacement metal gate transistor of claim 1, wherein the metal layer comprises first and second metal layers formed of different metals.

3. The replacement metal gate transistor of claim 2, wherein the sidewall sections of the second metal layer are at least 50% thinner than the bottom section of the second metal layer.

4. The replacement metal gate transistor of claim 3, wherein the bottom section of the second metal layer is at least 2 nanometers thick and the sidewalls sections of the second metal layer are less than or equal to 1 nanometer thick.

5. The replacement metal gate transistor of claim 1, wherein the sidewall sections of the metal layer are at least 50% thinner than the bottom section of the metal layer.

6. The replacement metal gate transistor of claim 5, wherein the bottom section of the metal layer is at least 2 nanometers thick and the sidewalls sections of the metal layer are less than or equal to 1 nanometer thick.

7. The replacement metal gate transistor of claim 1, wherein the dielectric layer is formed from a material selected from the group consisting of hafnium silicate, zirconium silicate, hafnium dioxide, or zirconium dioxide.

8. The replacement metal gate transistor of claim 1, wherein the metal layer is formed from a material including titanium nitride.

* * * * *